United States Patent [19]

Dohya et al.

[11] 4,434,544
[45] Mar. 6, 1984

[54] MULTILAYER CIRCUIT AND PROCESS FOR MANUFACTURING THE SAME

[75] Inventors: Akihiro Dohya; Yasuhiko Hino; Mitsuo Abe, all of Tokyo, Japan

[73] Assignee: Nippon Electric Co., Ltd., Tokyo, Japan

[21] Appl. No.: 429,636

[22] Filed: Sep. 30, 1982

Related U.S. Application Data

[62] Division of Ser. No. 232,051, Feb. 5, 1981, abandoned.

[30] Foreign Application Priority Data

Feb. 25, 1980 [JP] Japan .................................. 55-22471
Feb. 25, 1980 [JP] Japan .................................. 55-22472

[51] Int. Cl.³ ............................................ H01L 29/46
[52] U.S. Cl. .................................. 29/578; 29/569 R; 357/71; 427/89; 427/125; 174/68.5
[58] Field of Search ............... 29/576 J, 578, 569 R, 29/587; 174/68.5; 427/89, 90, 125; 357/71, 67

[56] References Cited

U.S. PATENT DOCUMENTS

| | | | |
|---|---|---|---|
| 3,350,498 | 10/1967 | Leeds | 474/68.5 |
| 3,386,894 | 6/1968 | Steppat | 427/89 X |
| 3,663,279 | 5/1972 | Lepselter | 427/89 X |

*Primary Examiner*—Brian E. Hearn
*Assistant Examiner*—David A. Hey
*Attorney, Agent, or Firm*—Sughrue, Mion, Zinn, Macpeak & Seas

[57] ABSTRACT

A multilayer circuit construction includes a conductive layer formed of an alloy of a noble metal and a small amount of a base metal disposed on a heat resistant insulating substrate. The portion of the substrate not covered with the conductive alloy is covered with an oxide of the base metal constituent of the alloy. The construction may be formed by depositing a base metal layer over the substrate, followed by depositing the noble metal over a part of the base metal layer. By oxidizing at high temperatures, the exposed base metal layer is converted to oxide, while the noble metal and the base metal thereunder diffuse into each other to form the alloy.

10 Claims, 14 Drawing Figures

MULTILAYER CIRCUIT AND PROCESS FOR MANUFACTURING THE SAME

This is a division of application Ser. No. 232,051, filed Feb. 5, 1981, now abandoned.

This invention relates to a multilayer circuit suitable for LSI (large scale integration) for use in data processing and communication systems, and to a process for manufacturing the same.

To manufacture a conventional multilayer circuit such as the one proposed in U.S. Pat. No. 3,350,498, a first conducting layer is formed on a selected surface portion of an insulating substrate by a screen printing technique. An insulating layer is then formed on both the remaining surface of the substrate and a selected surface portion of the first conducting layer. Finally, a second conducting layer is formed of a ground layer and a metal placed on the ground layer by a selective plating technique so that it may be electrically connected with said first conducting layer. However, such a process has the following disadvantages:

(1) Such a screen printing technique disturbs the fabrication of fine conductor lines (each having a width smaller than about 200 to 150 microns).

(2) If the same base metal is used for both the ground layer and the plated metal layer, these layers are unavoidably subjected to oxidization when exposed to an oxidizing atmosphere at a high temperature. For this reason, a protective layer must be employed on the surface of the base metal layer to prevent the corrosion thereof.

(3) On the other hand, if the ground layer is formed by a base metal and the plated metal layer is formed by a noble metal, a part of the ground layer underlying the plated metal is consequently etched by the etching of the ground layer (referred to as "a side-etching effect").

To achieve improved adhesion between the ground layer and the plated metal layer, a structure in which a noble metal different from that of the ground layer is formed on the ground layer is proposed in an article entitled "Preparation and Properties of Beam Crossovers for Interconnections in Thin Film Circuits" by A. Pfahnl and R. W. Berry, "Thin Solid Films", published in 1972 pp. 51–55.

This proposed circuit comprises a ground layer (consisting of an adhesive layer of titanium and a plating electrode layer of palladium) formed on a substrate, and a plated layer of gold provided on the ground layer. With such a structure, however, the side-etching effect will occur in the ground layer when the region of the ground layer on which no plated metal layer is coated, is removed by etching. As a result, in the multilayer circuit thus formed, each contact portion between the base metal and the noble metal is deteriorated by the diffusion of their metal atoms.

An effective process of manufacturing the multilayer circuit is disclosed in U.S. Pat. No. 3,461,347. In this process, a base metal layer is formed on a substrate. Also, the region of the base metal layer on which no conducting layer is coated, is oxidized to form an insulating layer by oxidizing the base metal layer. For this reason, the conducting layer must be formed of an oxidizable base metal. As a result, the base metal layer is unavoidably subjected to oxidation and corrosion.

An object of the present invention is, therefore, to provide a multilayer circuit and a process for manufacturing the same, free from the above-mentioned disadvantages.

According to one aspect of the present invention, there is provided a multilayer circuit which comprises a heat-resistant insulating substrate; a conducting layer consisting of an alloy of a noble metal and a small amount of base metal and formed on a predetermined region of said substrate; and an insulating layer consisting of an oxide of said base metal and formed on the remaining region of said substrate not covered by said conducting layer.

According to another aspect of the present invention, there is provided an improved process for manufacturing the multilayer circuit, which comprises the steps of: depositing a layer of base metal on a heat-resistant insulating substrate; depositing a conducting layer of noble metal on a predetermined region of said layer of base metal; and converting the remaining region of the base metal not covered by said conducting layer into an insulating metal oxide by oxidizing at a high temperature.

The present invention will be described in greater detail referring to the accompanying drawings wherein.

In the drawings, the same reference numerals denote the same structural elements.

Figure 1:
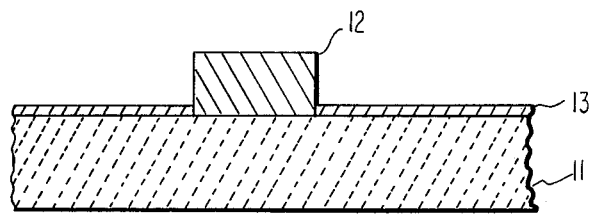
FIG. 1 shows a first embodiment of the present invention.

Referring to FIG. 1; a first embodiment of the present invention comprises a heat-resistant insulating alumina-ceramic substrate 11, a conducting layer 12 formed on a predetermined region of the substrate 11, and a titanium-oxide layer 13 formed on the remaining region of the substrate 11. The conducting layer 12 is formed by gold containing not more than one percent of titanium. Since the conducting layer 12 and the layer 13 are contiguous to each other, the above-mentioned side-etching effect does not occur at all.

Figure 2:
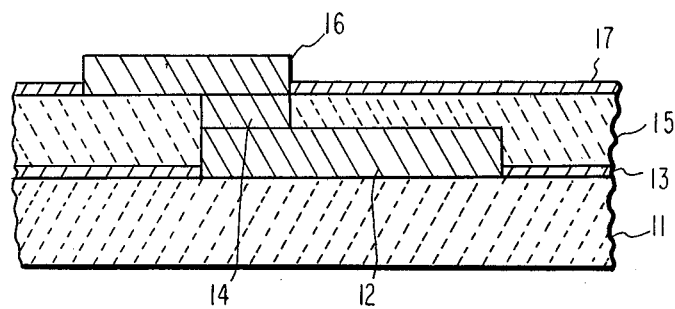
FIG. 2 shows a second embodiment of the present invention.

Referring to FIG. 2, a second embodiment comprises a heat-resistant insulating alumina-ceramic substrate 11, a first conducting layer 12 formed on a predetermined region of the substrate 11, a titanium-oxide layer 13 formed on the remaining region of the substrate 11, a connecting layer 14 formed on a predetermined region of the layer 12 by the same material as that of the conducting layer 12, an insulating layer 15 formed on the layer 13 and the remaining region of the layer 12, a second conducting layer 16 formed by the same material as each of the layers 12 and 14 on both the layer 14 and a predetermined region of the layer 15, and a titanium-oxide layer 17 formed on the remaining region of the layer 15. As shown, the insulating layer 15 is formed to the same level as that of the top surface of the layer 14. An inorganic insulating material containing alumina ($Al_2O_3$) or silicon dioxide ($SiO_2$) as a main ingredient is used for the layer 15. Each of the layers 12, 14, and 16 consists of gold containing a small amount of titanium. However, any other noble metals such as Ag, Pt, or Pd may be used instead of gold as said material. Such noble metals avoid not only the problems of diffusion and migration due to an electric current flow, but also the problems of oxidation and corrosion. The layer 13 of titanium used in the above-mentioned embodiments may be formed by any other base metal such as Al, Cu, W, Cr, Ta, or Si. The substrate 14 of alumina-ceramic may be formed by steatite or beryllia.

Figure 3A:
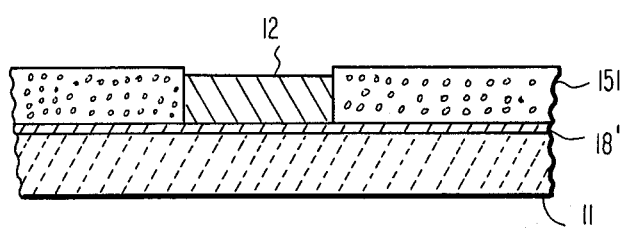
FIGS. 3A and 3B show a process of manufacturing the first embodiment.
Figure 3B:
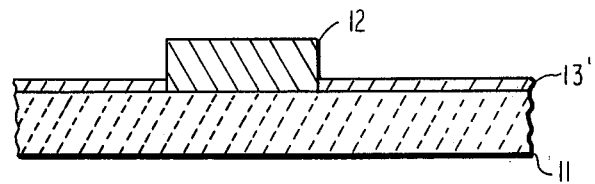

FIGS. 3A and 3B show a process for manufacturing the first embodiment.

As shown in FIG. 3A, a copper thin-film 18' having a thickness of 0.1 micron is deposited on the substrate 11 by a vacuum evaporating or a sputtering technique. Next, the entire surface of the film 18' except the region on which the conducting layer 12 is to be formed is coated with a photoresist 151. The layer 12 is then formed on the uncoated region of the film 18' having the photoresist 151 by a gold plating technique. In this plating process, the film 18' functions as the cathode electrode.

Referring to FIG. 3B, the structure thus formed is then heated at a high temperature of 500° C. to 600° C. (degrees centigrade) until the photoresist 151 is burnt off. The entire surface of the film 18' except for the portion immediately beneath the layer 12 is oxidized to form a copper oxide layer 13'. The oxygen atmospheric air at a high temperature of 600° C. to 900° C. causes the film 13' to oxidize the copper film 18'. Such a high temperature also causes the copper in the region beneath the layer 12 to be diffused into the gold layer 12.

Figure 4A:
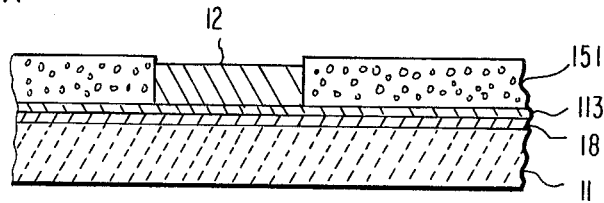
FIGS. 4A and 4B show another process of manufacturing the first embodiment.
Figure 4B:
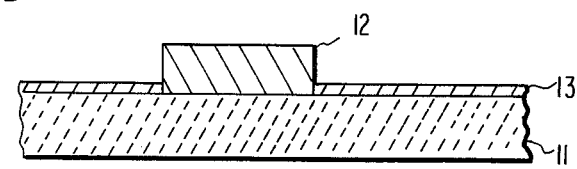

FIGS. 4A and 4B show another process for manufacturing the embodiment of FIG. 1.

As shown in FIG. 4A, a titanium thin-film 18 and a palladium thin-film 113 (each having a thickness of 0.1 micron) are deposited on the substrate 11 by the vacuum evaporating or the sputtering technique. Next, the entire surface of the film 113 except the region on which the conducting layer 12 is to be formed is coated with a photoresist 151. The layer 12 is then formed on the uncoated region of the film 113 having the photoresist 151 by a gold plating technique. In this plating process, the film 113 functions as the cathode electrode.

Referring to FIG. 4B, the structure thus formed is then heated at a high temperature of 500° C. to 600° C. (degrees centigrade) until the photoresist 151 is burnt off. The entire surface of the film 18 except for the portion immediately beneath the layer 12 is oxidized to form the titanium oxide layer 13. The oxygen atmospheric air at a high temperature of 600° C. to 900° C. causes the oxidation of the titanium film 18 through the film 113 having a thickness of 0.1 micron. Such a high temperature also causes the titanium and palladium in the region beneath the layer 12 to be diffused into the gold layer 12. Subsequently, the remaining region of the palladium film 113, which is not covered by the layer 12, is removed by etching by use of a solution of $FeCl_3$ (7.0 weight percent), HCl (46.5 weight percent), and $H_2O$ (46.5 weight percent). In this case, the side-etching effect does not occur at all since the palladium-etching solution employed is totally ineffective for etching the layer 12 (consisting of an alloy of gold and palladium). Also, since palladium is used as a ground metal, the conducting gold layer, having a good adhesivity with the ground metal, can be easily plated. The palladium also serves to prevent the oxidation of such ground metal before the gold plating process is performed.

Figure 5A:
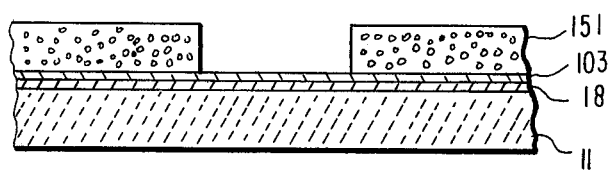
FIGS. 5A to 5C show a modification of the first embodiment and a process for the same.
Figure 5B:
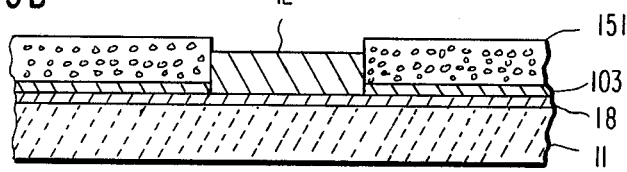
Figure 5C:
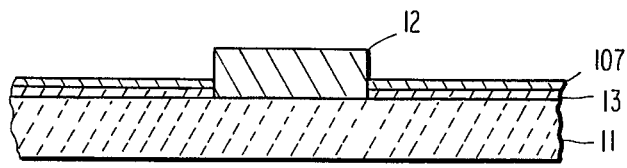

FIGS. 5A to 5C show a modification of the first embodiment and a process for the same.

Referring to FIG. 5A, the titanium film 18 and an aluminum film 103 (each having a thickness of 0.1 micron) are deposited on the entire surface of the alumina-ceramic substrate 11 by the vacuum evaporation or sputtering technique. The entire surface of the film 103 except the region on which the conducting layer 12 is to be formed is then coated by the photoresist 151.

Next, referring to FIG. 5B, the uncoated region of the aluminum film 103 is then removed by etching, and gold plating is performed over the exposed film 18 to form the conducting layer 12. The layer 12 has a highly uniform thickness since the layer 103 is used as a plating cathode of a comparatively low resistance. The above-mentioned etching of the film 103 facilitates the formation of a practically defect free plated gold layer 12 having good adhesivity.

Next, turning to FIG. 5C, the structure thus formed is then heated at a high temperature of 500° to 600° C. so that the photoresist 151 is burnt off. After that, the structure is heated at a high temperature of 600° C. to 900° C. As a result, the entire surfaces of the films 18 and 103 except for the portion immdiately beneath the layer 12 are oxidized to form the titanium oxide layer 13 and the alumina layer 107, respectively. In this example, since the film 103 is etched before the gold plating process, the side-etching effect does not occur in the conducting layer 12.

FIGS. 6A to 6E show a process for manufacturing the embodiment shown in FIG. 2.

Figure 6A:
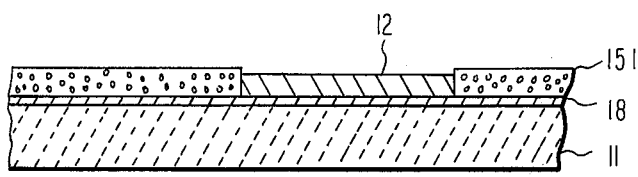
FIGS. 6A to 6E show a process of manufacturing the second embodiment.

As shown in FIG. 6A, the titanium film 18 having a thickness of 0.1 micron is deposited on the alumina-ceramic substrate 11 by the vacuum evaporation or the sputtering technique. The surface of the film 18 except the region on which a conducting layer is to be formed is then coated with the photoresist layer 151. A first conducting layer 12 is formed on the uncoated region of the titanium film 18 by a gold plating process using the film 18 and the layer 151 as the cathode electrode and a mask respectively.

Figure 6B:
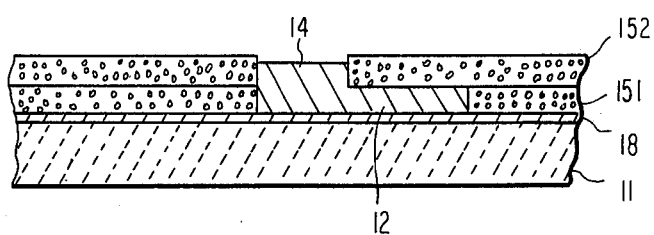

Turning to FIG. 6B, both the surface of the layer 12 except the region on which the connecting layer 14 is formed and the entire surface of the photoresist layer 151 are coated with another photoresist layer 152. The layer 14 is formed on the uncoated region of the layer 12 by gold plating, using the layer 152 as a mask.

Figure 6C:
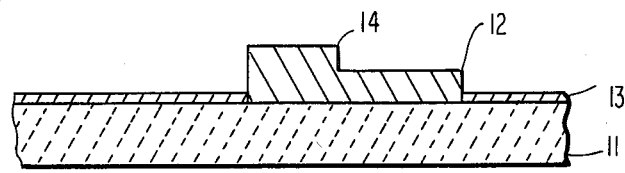

Referring to FIG. 6C, the structure thus formed is then heated at a high temperature of 500° C. to 600° C., so that the photoresist layers 151 and 152 are burnt off. After that, the structure is heated at a high temperature of 600° C. to 900° C. As a result, titanium atoms in the region of the film 18 covered by the layer 12 of gold are diffused into the layer 12. At the same time, the region of the titanium film 18 not covered by the layer 12 is oxidized to form the titanium oxide layer 13. On the other hand, the interdiffusion of the gold atoms between the conducting layer 12 and the connecting layer 14 is done so as to consolidate these layers 14 and 12 into an incorporated form.

Figure 6D:
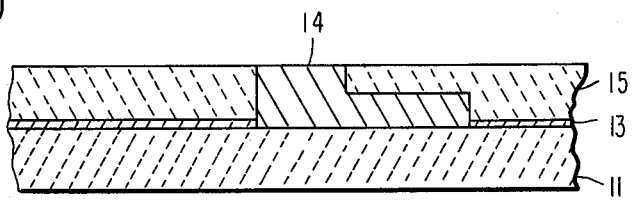

As shown in to FIG. 6D, the insulating layer 15 of an inorganic insulating material is formed on the structure shown in FIG. 6C, except for the top surface of the layer 14, to the same level as that of the top surface of connecting layer 14. This manufacturing process is as follows:

A large amount of insulating paste (not shown) is first printed on the structure shown in FIG. 6C and the whole structure is then baked at a temperature of 900° C. The consequent insulating layer (not shown) is then reduced by a surface grinding process until the top surface of the layer 14 is exposed. Next, a second conducting layer 16 is formed on both the flat top surface of the layer 14 and a predetermined surface area of the layer 15 by a repeat of the process described above.

Figure 6E:
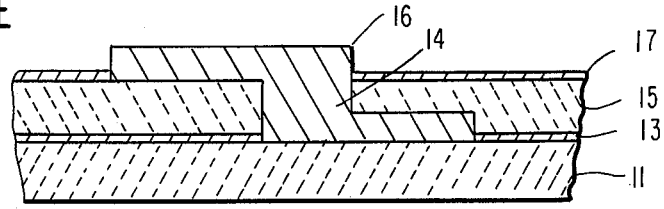

As is evident from FIG. 6E, the interdiffusion of the gold atoms between the layer 16 and the layer 14 is achieved so as to consolidate these layers 14 and 16 into an incorporated form. A titanium oxide layer 17 is formed on the layer 15 not covered by the layer 16.

As has been discussed above, the present invention enables the fabrication of fine conducting layers 12 and 16 of a noble metal by preventing the side-etching effect. In addition, the invention allows a highly reliable electrical connection between the conducting layers 12 and 16 by the use of the same conducting material. Finally, many alternatives to the shown embodiments may be made within the scope of the present invention defined by the appended claims.

What is claimed is:

1. A process for manufacturing a multilayer circuit comprising the steps of:
   depositing a layer consisting of a base metal on a heat-resistant insulating substrate;
   depositing a thin film layer of a first noble metal on said layer of base metal;
   depositing a conducting layer of second noble metal on a predetermined region of said thin film layer of said first noble metal;
   converting the remaining region, not covered by said conducting layer, of said base metal into an insulating metal oxide by oxidizing at a high temperature, said oxidizing step also producing an alloy of said first noble metal and said second noble metal; and
   removing the remaining region, not covered by said conducting layer, of said thin film layer of said first noble metal by etching with an etching solution ineffective for etching the alloy of said first noble metal and said second noble metal.

2. A process for manufacturing a multilayer circuit comprising the steps of:
   depositing a layer consisting of a first base metal on a heat-resistant insulating substrate;
   depositing a thin film layer consisting of a second base metal on a predetermined region of said layer of said first base metal;
   removing a portion of said thin film layer by etching, to expose a portion of said first base metal;
   depositing a conducting layer of a noble metal on said exposed portion of said layer of said first base metal by plating; and
   converting the remaining region, not covered by said conducting layer, of said first and second base metals into, insulating metal oxides, by oxidizing at a high temperature.

3. A process for manufacturing a multilayer circuit comprising the steps of:
   depositing a layer of a base metal on a heat-resistant insulating substrate;
   depositing a conducting layer of a noble metal on a predetermined region of said base metal layer;
   depositing a connecting layer of the same noble metal as that of said conducting layer on a predetermined region of said conducting layer;
   converting the regions, not covered by said conducting layer, of said base metal into an insulating metal oxide by oxidizing at a high temperature; and
   depositing an insulating layer on both the uncovered regions of said conducting layer, and on said insulating base metal oxide to a level equal to the level of the top surface of said connecting layer.

4. A process for manufacturing a multilayer circuit claimed in claim 1, or claim 2, wherein said high temperature is set at 600 to 900 degrees centigrade.

5. A process for manufacturing a multilayer circuit claimed in claim 3, wherein said high temperature is set at 600 to 900 degrees centigrade.

6. A process for manufacturing a multilayer circuit as claims in claim 3, wherein the step of depositing and insulating layer comprises the steps of:
   (a) depositing a thick layer of insulating paste over the insulating base metal oxide layer, the conducting layer and the connecting layer;
   (b) baking said paste at a high temperature; and
   (c) grinding said baked layer of insulating paste until the top surface of said connecting layer is exposed.

7. A process for manufacturing a multilayer circuit as claimed in claim 1, further comprising the step, prior to depositing said conductive layer, of depositing a layer of photoresist material over said thin film layer except for said predetermined region.

8. A process for manufacturing a multilayer circuit as claimed in claim 2, further comprising the step, prior to etching said thin film layer, of depositing a layer of photoresist material over said thin film layer except for a predetermined region, said photoresist layer being used as a mask during said etching step.

9. A process for manufacturing a multilayer circuit as claimed in claim 3, further comprising the step, prior to depositing said conductive layer, of depositing a first layer of photoresist material over said base metal layer except for said predetermined region of said base metal layer; and, prior to depositing said connecting layer, depositing a second photoresist layer of said conductive layer and said first photoresist layer, except for said predetermined region of said conducting layer.

10. A process for manufacturing a multilayer circuit as claimed in claims 7, 8 or 9, wherein said converting step comprises the steps of:
   (a) burning off said photoresist material by heating to a temperature of 500° to 600° C.; and
   (b) oxidizing, at a temperature of 600° to 900° C.

* * * * *

UNITED STATES PATENT AND TRADEMARK OFFICE
CERTIFICATE OF CORRECTION

PATENT NO. : 4,434,544
DATED : March 6, 1984
INVENTOR(S) : Dohya et al

It is certified that error appears in the above-identified patent and that said Letters Patent is hereby corrected as shown below:

Column 1, line 19, after "metal" insert --layer--.

Column 6, line 24, change "claims" to --claimed--.

Signed and Sealed this

Ninth Day of October 1984

[SEAL]

Attest:

GERALD J. MOSSINGHOFF

Attesting Officer

Commissioner of Patents and Trademarks